(12) United States Patent
Taylor (10) Patent No.: US 6,510,098 B1
(45) Date of Patent: Jan. 21, 2003

(54) METHOD AND APPARATUS FOR TRANSFERRING DATA IN A DUAL PORT MEMORY

(75) Inventor: Ronald T. Taylor, Grapevine, TX (US)

(73) Assignee: Cirrus Logic, Inc., Austin ( * ) Notice: Subject to any disclaimer, the term of this patent is extended or adjusted under 35 U.S.C. 154(b) by 0 days.

(21) Appl. No.: 08/864,506

(22) Filed: May 28, 1997

(51) Int. Cl.[7] .................................................. G11C 8/00
(52) U.S. Cl. ......................... 365/230.05; 365/189.04; 365/230.03; 365/230.06
(58) Field of Search .................. 365/230.05, 189.04, 365/230.01, 230.06, 230.03

(56) References Cited

U.S. PATENT DOCUMENTS 5,305,280 A * 4/1994 Hayano ............. 365/189.04 X
5,369,620 A * 11/1994 Sugibayashi ........... 365/230.03
5,657,266 A * 8/1997 McLaury ........... 365/230.05 X
5,657,273 A * 8/1997 Ayukawa et al. ... 365/230.05 X
5,687,132 A * 11/1997 Rao ...................... 365/230.03

* cited by examiner

Primary Examiner—Huan Hoang
(74) Attorney, Agent, or Firm—James J. Murphy, Esq.; Winstead Sechrest & Minick, P.C.

(57) ABSTRACT

A memory system 20 includes a first array 100 and a second array 102 of memory cells. The memory system allows for a quick transfer of the contents of one of the arrays with another one of the arrays. Through the use of a transfer gate (128) interposed between column decoders (150 and 152) corresponding to the two memory arrays, data may be transferred between the two arrays in a single timing cycle. Furthermore, even given the interconnection between the two memory arrays due to the transfer gate, the two memory arrays can be operated independently of one another, with respect to address, data, and timing information.

10 Claims, 5 Drawing Sheets

METHOD AND APPARATUS FOR TRANSFERRING DATA IN A DUAL PORT MEMORY

CROSS-REFERENCE TO RELATED APPLICATION

The present patent application is related to the following co-pending and co-assigned patent application entitled: DUAL PORT MEMORIES AND SYSTEMS AND METHODS USING THE SAME, U.S. patent application Ser. No. 08/666,815 and filed Jun. 19, 1996.

TECHNICAL FIELD

The present invention relates in general to a computer processing subsystems, and in particular to dual port memories and systems and methods of using the same.

BACKGROUND INFORMATION

A typical computer processing system includes a central processing unit (CPU), and main memory, and other hardware devices, such as storage devices, keyboards, display devices and network controllers. All of these components are generally connected together through at least one bus. In addition, an input/output (input or output or both) subsystem, typically comprised of various I/O subsystem devices distributed throughout the system, is included which controls the interconnections between the computer bus(s), CPU memory and other hardware devices.

Among other things, the I/O subsystem mediates the transfer of data between hardware devices, which may vary in many aspects, such as speed, supply voltage, and bus protocol. Additionally, the I/O subsystem accounts for limitations in the computer processing system standard architecture. Recently, however, the basic I/O subsystem used in the industry has needed modification, in part because advances in the performance of the CPU, memory and other hardware devices have not occurred uniformly. Despite such differences in hardware performance, there remains a desire to maintain various industry standards in the computer processing system architecture. As a result, data transfer rates still vary significantly with any given system.

The I/O subsystem is typically made up of various controller circuits and memory caches or buffers which operate independently as intermediaries between the computer processing system components. Typical I/O subsystem controller circuits may vary in configuration and function according to specific applications, but in general are required to adapt to data structures and to translate between selected hardware protocols to maintain efficient communication within the system. Also, although the I/O subsystem memory cache and buffers may vary in structure and operation according to specific applications, they generally must transfer data at rates that meet or exceed the data transfer rates of the hardware devices connected therewith. The memory cache may also cooperate with an associated controller circuit in adapting the data structure.

The core logic is a particular I/O subsystem device which generally ties the other hardware devices together. Early core logic designs included direct memory access (DMA) controllers, interrupt control devices and a timer-counter device. Later, the industry standard architecture (ISA) bus controller and bus buffer, previously separate I/O subsystem devices, were combined with the core logic chip set. Present core logic designs for a peripheral component interconnect (PCI) bus architecture additionally include the CPU local bus to PCI bridge, a PCI to ISA bridge, to maintain compatibility with earlier ISA bus architectures, and system memory and cache controllers. The implementation of the PCI bus bridges in the core logic is intended to provide a standard architecture for interfacing the CPU with other hardware devices, such as the system memory controller, the cache controller, and the video display adapter or controller. These hardware devices were previously connected directly to the CPU local bus. However, because CPU local busses are different for each CPU, upgrading the CPU required the upgrade of all of the hardware device connections made to CPU local bus. Presently, since these hardware devices connect to the CPU local bus through the core logic of PCI bus, upgrading the CPU nearly requires replacing the CPU chip and the CPU local bus to the PCI bridge chip. However, while providing upgrade capabilities in the system architecture, the present PCI bus and core logic architecture creates a potential bottleneck by channeling all information to and from the CPU through the core logic and the CPU local bus to the PCI bridge chip.

The CPU communicates through the core logic to handle management of the system buses and to execute various offer applications. Currently, most industry computer busses are managed by the CPU. In this capacity, the CPU is a system master and generally provides overall system control in conjunction with the software operating system. The CPU, in addition to managing the data transfers on the busses, still handles execution of the software operating system and software applications. To alleviate the potential bottleneck created by the CPU local bus to PCI bridge, it is desirable to transfer some CPU management functions to the core logic.

In sum, with the advent of high performance processors, memories, and other hardware devices, the differences between the performance capabilities of these hardware devices has increased. The need has, therefore, arisen for improvements to the I/O subsystem and I/O subsystem devices. In particular, a need has arisen for improvements in the core logic to minimize performance conflicts between devices performing independent tasks and operating at different speeds.

In addition, advances in software complexity and the advent of multimedia applications have substantially increased the demand for high speed and large volume data transfers which require channeling large amounts of data between storage devices and display devices or sound devices. Often, the requirements of multimedia applications conflict with the computer processing system architecture which was not designed for such applications. In the past, the CPU handled all data transfers between various computer processing system devices. In order to meet the data transfer demands of multimedia applications, some historical CPU tasks have been delegated to I/O subsystem controllers, but the need still exists for improving the transfer rates of data through the I/O subsystem.

SUMMARY OF THE INVENTION

The previously mentioned needs are fulfilled with the present invention. Accordingly, there is provided, in one form, a memory system. The memory system includes a first array of memory cells and a second array of memory cells. The memory system also includes the first column decoder which is connected to the first array of memory cells for selectively accessing a location of cells within the first array of memory cells. A second column decoder is connected to the second array of memory cells for selectively accessing a location of cells within the second array of memory cells. The memory system also includes a transfer circuit for selectively transferring a first data value from a selected location of the first array to the second array and for selectively transferring a second data from a selected location in the second array to the first array.

Additionally, there is provided, in a second form, a memory system. The memory system includes a control circuit for receiving a first plurality of address bits, a first plurality of control bits, a second plurality of address bits, and a second plurality of control bits. The control circuit selectively generates a transfer control signal in response to the first plurality of control bits and the second plurality of control bits. The memory system also includes the first array of memory cells having a first plurality of rows and a first plurality of columns. A first one of the first plurality of rows corresponds to a first predetermined word line in the first one of the first plurality of columns corresponds to a first predetermined bit line. The memory system also includes a second array of memory cells having a second plurality of rows and a second plurality of columns. A first one of the second plurality of rows corresponds to a second predetermined word line and a first one of the second plurality of columns corresponds to a second predetermined bit line. A first column decoder is connected to the first bit line of the first array to selectively access the first array of memory cells. A second column decoder is connected to the second bit line of the second array to selectively access the second array of memory cells. A transfer gate has a first terminal connected to the first predetermined bit line, a second terminal connected to the second predetermined bit line, and a third terminal connected to a source of the transfer control signal. The transfer gate selectively transfers a first data accessed by the first column decoder to the second column decoder and selectively transferring a the second data accessed by the second column decoder to the first column decoder in response to a logic state of the transfer control signal.

Furthermore, there is provided, in a third form, a method for operating a memory system having a first array of memory cells and a second array of memory cells. The first array is associated with a first column decoder and the second array is associated with a second column decoder. The method includes the step of exchanging a first data between the first column decoder and the first array of memory cells. A second data is then exchanged between the second column decoder and the second array of memory cells. A transfer circuit is selectively enabled to transfer the first data value from the first column decoder to the second column decoder. Additionally, the transfer circuit is selectively enabled to transfer the second data value from the second column decoder to the first column decoder.

These and other features, and advantages, will be more clearly understood from the following detailed description taken in conjunction with the accompanying drawings. It is important to note that the drawings are not intended to represent the only form of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

In the present invention, a memory system is implemented which allows for the quick transfer of the contents of one memory sub-array to another memory sub-array. Through the use of a transfer gate interposed between column decoders corresponding to the two memory sub-arrays, data may be transferred between the two sub-arrays in a single timing cycle. Furthermore, even given the interconnection between the two memory sub-arrays due to the transfer gate, the two memory sub-arrays can each be operated independently of one another, with respect to address, data, and timing information. While the foregoing has provided a general description of the present invention, a following discussion will set forth the specific details of the present invention in greater detail.

In the following description, numerous specific details are set forth such as specific word or byte lengths, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Figure 1:
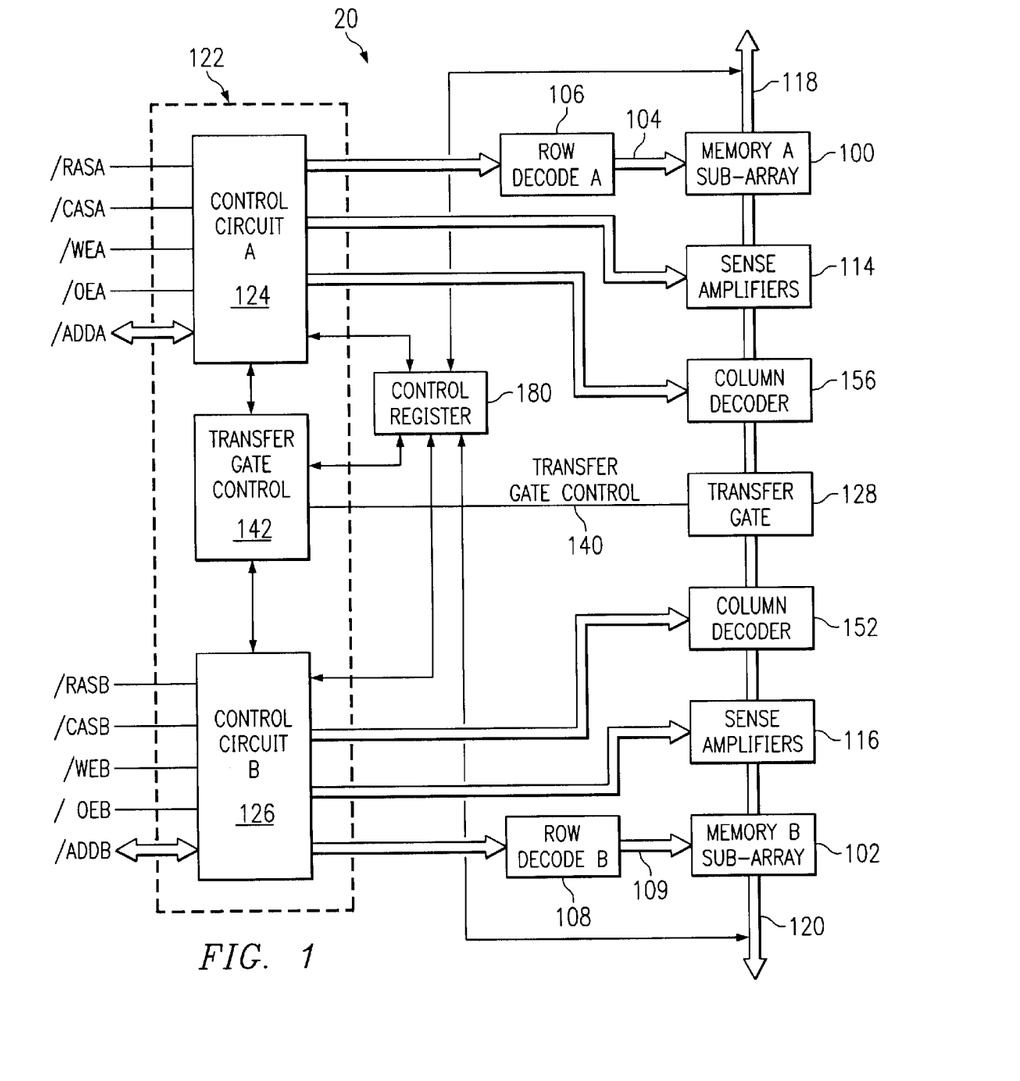
FIG. 1 is a functional block diagram of a dual port memory illustrating one embodiment of the present invention.

As illustrated in FIG. 1, the present invention is embodied in a dual port memory device, indicated generally by the reference number 20, for reading and writing data through two separate data ports. Dual port memory device 20 comprises an array of "N" rows and "M" columns of memory cells comprising an upper bank or a first memory A sub-array 100 and a lower bank or memory B sub-array 102. It should be noted that N and M are integer numbers. In one embodiment of the present invention, the cells are dynamic random access memory (DRAM) cells. In an alternate embodiment of the present invention, other memory devices, such as static random access memory (SRAM) cells may be used.

The size and organization of memory A sub-array 100 and memory B sub-array 102 may vary according to an intended use of memory device 20. However, some basic relationships are preferably maintained. In general, the sub-arrays (100, 102) preferably have an equal or M number of columns of memory cells. In contrast, the number of rows of each sub-array 100 and 102 may vary. However, those skilled in the data processing art will appreciate that addressing advantages are achieved when a number of rows is equal. In one embodiment of the present invention, memory A sub-array 100 comprises rows 0 to $N/2-1$, and memory B sub-array 102 comprises rows $N/2$ to N−1, where 0 to N equals N number of rows. For purposes of illustration, a folded bit line architecture will be described in further detail herein.

Figure 2:
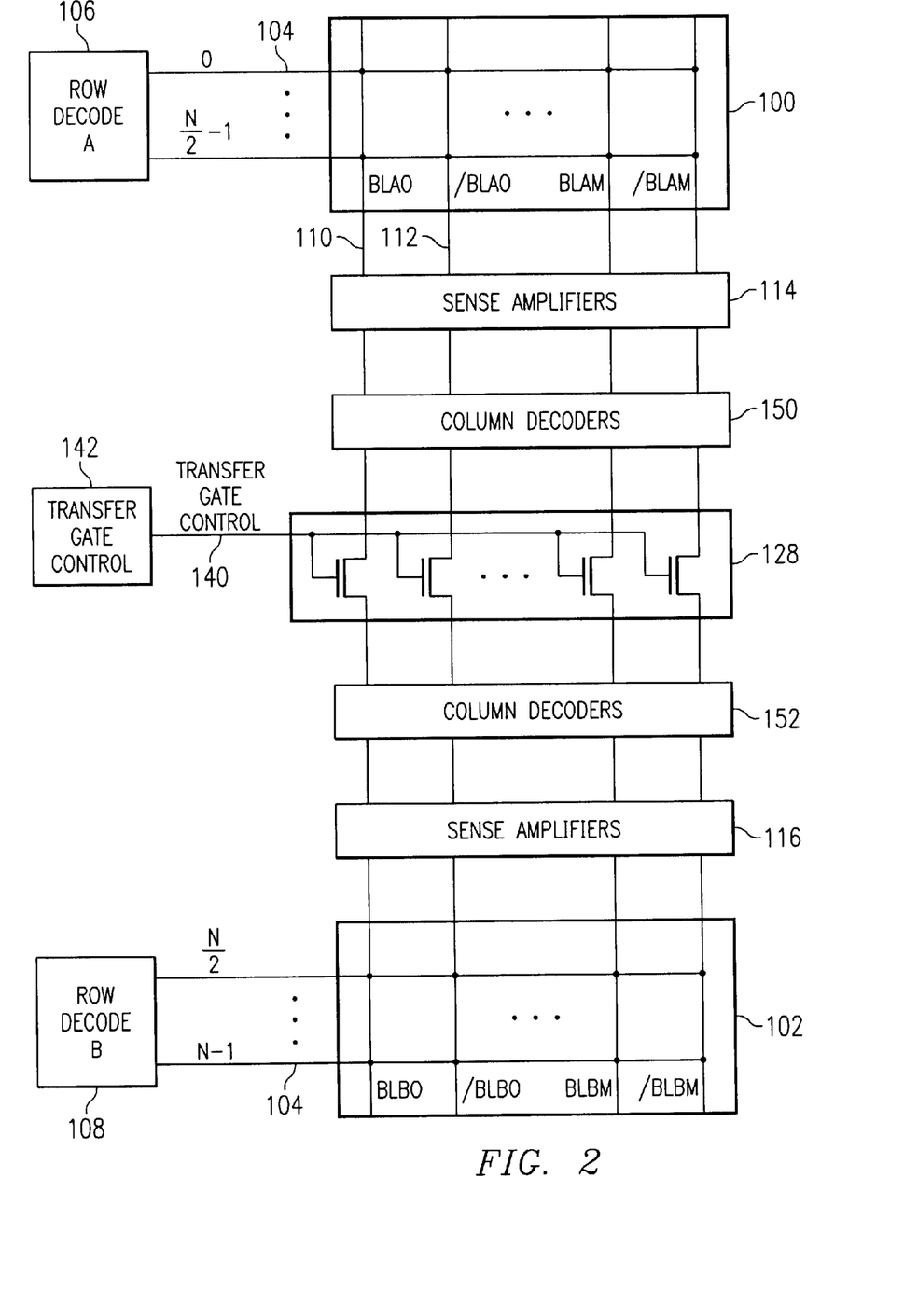
FIG. 2 is a partial circuit diagram of a portion of a dual port memory of FIG. 1, including a circuit diagram of a transfer gate in accordance with one embodiment of the present invention.

Refer now to FIG. 2. In FIG. 2, each row of memory A sub-array 100 and memory B sub-array 102 is associated with a conductive wordline 104. The wordlines of memory A sub-array 100 are coupled to and controlled by a first row decoder circuit 106 and the wordlines of memory B sub-array 102 are coupled to and controlled by a second row decoder circuit 108.

As is illustrated in FIG. 2, the columns of cells of the first and second sub-arrays are arranged as pairs folded in half-bit lines. For a given row, one half-bit line 110 transfers "true logic" level data and the other half-bit line 112 is latched to a complement of that data by the corresponding sense amplifier. As illustrated in FIG. 2, bit line pairs BLA0 and /BLA0 to BLAM and /BLAM, respectively, are included within memory A sub-array 100, and bit line pairs BLB0 and /BLBL to BLBM and BLBM are included within memory B sub-array 102. The bit lines of memory A sub-array 100 are coupled conventionally to first sense amplifier 114, which in turn is coupled to a first column decoder 150. Similarly, the bit lines of memory B sub-array 102 are coupled conventionally to a second sense amplifier circuit 116, which is then coupled to a second column decoder 152.

Sense amplifier circuits 114 and 116 and column decoders 150 and 152 are preferably conventional design. As is well-known in the data processing art, column decoders 150 and 152, sense amplifiers 114 and 116, and row decoders 106 and 108 are preferably constructed from dynamic circuitry, although static circuitry could alternatively be used. Memory A sub-array 100 and memory B sub-array 102 are conventionally coupled to a first data port 118 (port A) and a second data port 120 (port B), respectively. For brevity and clarity, the conventional data input/output buffers and latches associated with data ports 118 and 120 are not illustrated in detail herein.

As was illustrated in FIG. 1, a memory control circuit 122 is coupled to row decode circuit 106, sense amplifiers 114, column decoder 150, column decoder 152, sense amplifiers 116, and row decode circuit 108. Memory control circuit 122 is operatable to enable reading, writing, and refreshing of data within each of memory A sub-array 100 and memory B sub-array 102 via the respective data ports independently and asynchronously in a conventional manner. To accomplish this task, memory control circuits may include first and second controller circuits 124 and 126, wherein each controller circuit 124 and 126 receives addresses and conventional DRAM control signals including a row addressed strobe (/RAS), a column addressed strobe (/CAS), a write enable (/WE) signal, and an output enable (/OE) signal from a corresponding external device. In one embodiment of the present invention, first and second controller circuits 124 and 126, row decoder circuits 106 and 108, and sense amplifiers 114 and 116, and column decoders 150 and 152 are generally operative to control the independent reading and writing of data through a corresponding one of the data ports 118 and 120. Additionally, each of these elements is also generally operatable to perform refresh cycles for a respective one of memory A sub-array 100 and memory B sub-array 102 in a conventional manner. The structure and operation of these components for use in such operations are more fully described in U.S. patent application Ser. No. 08/548,752, which is hereby incorporated herein by reference.

Figure 3:
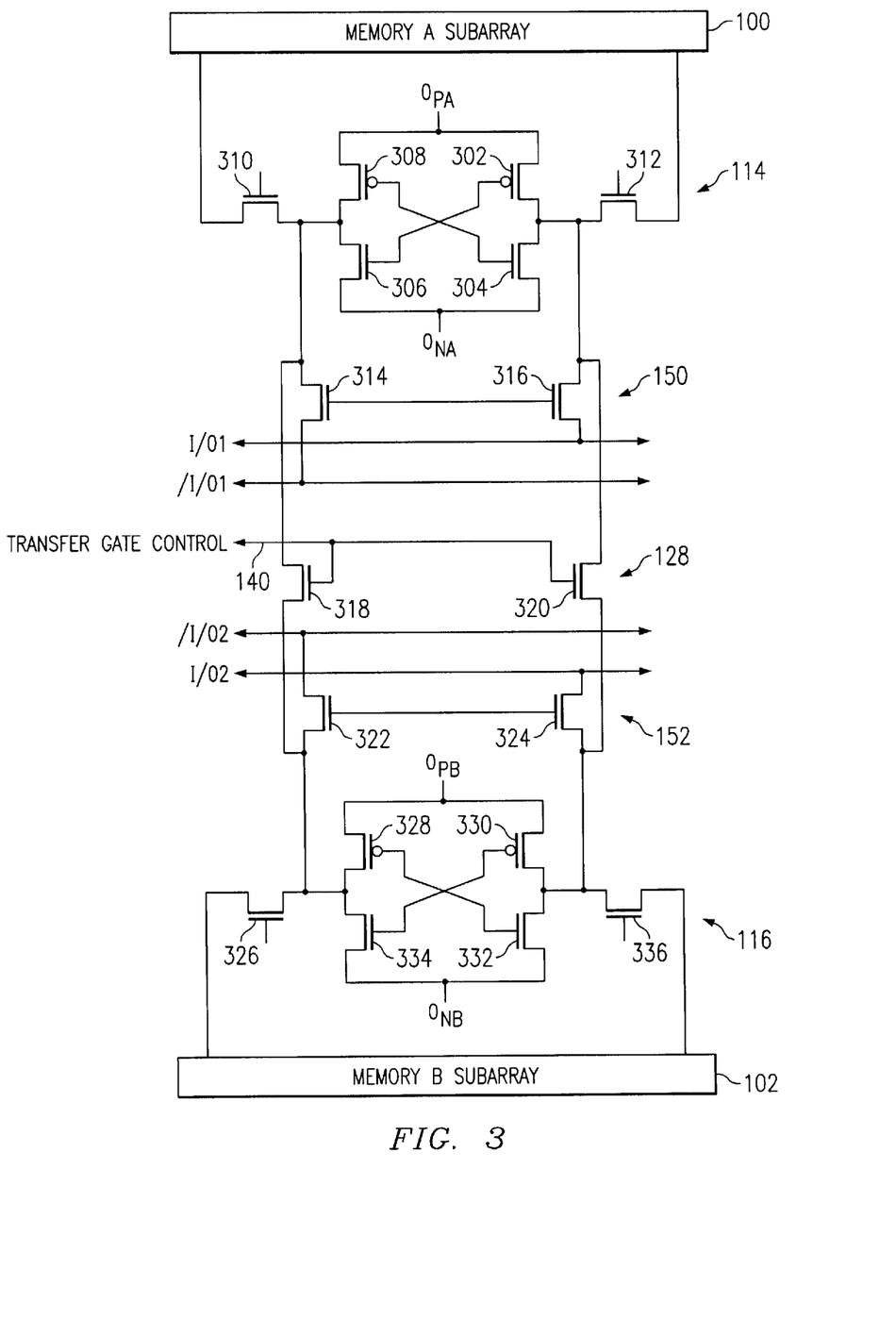
FIG. 3 is a circuit diagram of a portion of the dual port memory of FIG. 1.

Turning now to one embodiment of the present invention, dual port memory 20 further includes a transfer gate 128 for selectively connecting sense amplifier nodes of the first column decoder 150 associated with memory A sub-array 100 and the second column decoder 152 associated with memory B sub-array 102. In the alternative, the transfer node may selectively connect bit lines of memory A sub-array 100 and memory B sub-array 102. FIG. 3 provides a bit slice circuit diagram of a portion of memory 20 formed by memory A sub-array 100, sense amplifiers 114, column decoder 150, transfer gate 128, column decoder 152, sense amplifiers 116, and memory B sub-array 102. In FIG. 3, sense amplifier 114 comprises a transistor 302, a transistor 304, a transistor 306, a transistor 308, a transistor 310, and a transistor 312. The configuration and operation of sense amplifier 114 are well-known to those with skill in the data processing art and will not be described in greater detail herein.

Furthermore, in FIG. 3, column decoder 150 comprises a transistor 314 and a transistor 316. In one embodiment of the present invention, a drain terminal of transistor 314 is coupled to a /I/O 1 bus and a drain terminal of transistor 316 is coupled to an I/O 1 bus. Column decoder 150 and the use of sense amplifier pre-charge clocks $\phi_{PA}$, $\phi_{NA}$, $\phi_{PB}$, and $\phi_{NB}$ function in a manner well-known to those with skill in the relevant data processing art. Therefore, details of operation of column decoder 150 will not be described in greater detail herein.

A source terminal of transistor 314 is coupled to a source terminal of transistor 318. Similarly, a source terminal of transistor 316 is coupled to a source terminal of transistor 320. A transfer gate control signal 140 is provided to a gate terminal of each of transistors 318 and 320. It should be noted that in one embodiment of the present invention, transistors 318 and 320 illustrate a portion of transfer gate 128. In transfer gate 128, a series of NMOS-type transistors may be coupled in parallel, where each of the series of transistors has a source terminal coupled to a corresponding sense amplifier node provided from a column decoder (150) and a drain terminal coupled to the corresponding sense amplifier nodes in the second column decoder (152). The gates of the series of transistors forming transfer gate 128 are preferably coupled in parallel to the transfer gate control signal. Transfer gate control signal 140 selectively asserts or negates the gates of the series of transistors forming transfer gate 128. When applying the transfer gate control signal to a NMOS transistor, a high signal creates a closed circuit which allows current to flow between the respective sense amplifier nodes corresponding to column decoder 150 and column decoder 152. Conversely, a negated transfer gate control signal 140 creates an open circuit which isolates the respective sense amplifier nodes corresponding to column decoder 150 and column decoder 152.

It should be noted that controller circuit 122 comprises a transfer gate control circuit 142. Transfer gate controller circuit 142 is coupled to the gates of each of the series of transistors forming transfer gate 128, as well as control circuit A 124 and control circuit B 126. Transfer gate control circuit 142 generally arbitrates data transfers between memory A sub-array 100 and memory B sub-array 102 via the series of transistors 318 through 320. More specifically, transfer gate control 142 provides for proper timing and sequencing of signals between control circuit A 124 and control circuit B 126, when a data transfer has been requested. Preferably, a data transfer between memory A sub-array 100 and memory B sub-array 102 will occur at the request of either control circuit A 124 or control circuit B 126.

During a normal mode of operation, memory A sub-array 100 and memory B sub-array 102 are accessed independently and asynchronously through data ports 118 and 120, respectively. Memory A sub-array 100 and memory B sub-array 102 are accessed in response to independently generated addresses and DRAM control signals presented at control circuit A 124 and control circuit B 126, respectively. Specifically, accesses of memory A sub-array 100 are controlled by /RASA, /CASA, /WEA and /OEA, together with the addresses appearing on address port ADDA. Similarly, accesses to memory B sub-array 102 are controlled by /RASB, /CASB, /WEB and /OEB, together with the addresses appearing on address port ADDB. In each case, the DRAM control signals perform conventional functions typically associated therewith. For example, each /RAS signal times the precharge inactive cycles of the corresponding array and latches row addresses presented to a corresponding address port. The /CAS signals time an input of the column addresses that control the outputs of a corresponding column decoder. The /OE and /WE signals similarly control the output and input data latches and buffers in a conventional manner. The use of independent control signals and addresses in the normal mode of operation allow memory A sub-array 100 and memory B sub-array 102 to support at least two asynchronously operating devices. In particular, by appropriate selection of the timing of control signals and addresses, memory A sub-array 100 and memory B sub-array 102 can advantageously support devices operating at substantially different clock rates.

In a transfer mode of the present invention, the timing of the accesses to memory A sub-array 100 and memory B sub-array 102 are closely timed or locked. Preferably, either the addresses and control signals presented at control circuit A 124, respectively referred to as ADDA, /RASA, /CASA, /OEA, and /WEA, or the addresses and control signals presented at control circuit B 126, referred to as ADDB, /RASB, /CASB, OEB, and /WEB, are used to control both memory sub-arrays 100 and 102.

In one embodiment of the present invention, transfer gate controller circuit 142 selects control of the transfer operation from signals appearing at control circuit A 124 and control circuit B 126, as a function of the request for a transfer access. Thus, if the device coupled to control circuit A 124 presents its request for transfer first, then the set of address and control signals provided to control circuit A 124 (the "A set") of control signals and addresses determine and control operation of transfer gate 128 to the exclusion of the control signals provided by control circuit B 126. Additionally, it should be well-known to those with skill in the art that if the device coupled to control circuit B 126 presented its request first, the "B set" of control signals and addresses would be used to control operation of memory 20.

During a transfer operation, a row address from a controlling device, whether control circuit A 124 or control circuit B 126, is preferably used to access both memory A sub-array 100 and memory B sub-array 102. It should be noted, however, that an offset may be added to the received controlling address to allow for a change in rows between the source and destination arrays. It should also be noted that after the initial addresses received from one of the external devices, multiple row transfers may be implemented with internal row address incrementation. Such internal row address incrementation may be executed using an internal refresh counter in one example. In this case, either the /RAS signal from the external controlling device or an internally generated /RAS signal would be used to time the active and precharged cycles for one or both sub-arrays.

Data transfers between memory A sub-array 100 and memory B sub-array 102 advantageously rely on the refresh circuitry of sense amplifier circuits 114 and 116 of sending and receiving memory sub-arrays (100 and 102). As an example, the timing of the transfer of data from one row in memory A sub-array 100 to memory B sub-array 102 will be discussed in detail below in conjunction with FIG. 5.

Generally, charge from the cells of a selected row in memory A sub-array 100 result in a small change in the charge on the corresponding sub-array half-bit lines. The sense amplifiers then sense the change in charge when sending information from memory A sub-array 100. The sense amplifier 114 senses the change in charge when memory A sub-array 100 sends data. In response to this detected change in charge, half-bit lines and complementary half-bit lines associated with memory A sub-array 100 are latched to the appropriate full logic voltage levels. Furthermore, besides preparing for the transfer of data to a corresponding row, the sensing and latching operations in memory A sub-array 100 (the sending sub-array) refresh the data in the addressed row. Once sense amplifier circuits 114 have latched the sending half-bit lines, transfer gate 128 may be closed and a charge sent to the bit lines of the receiving sub-array (memory B sub-array 102). After a delay, half-bit lines associated with memory B sub-array 102 (the receiving sub-array) are sensed and latched in sense amplifiers 116. That data then overwrites the data of the cells of the selected row within memory B sub-array 102.

As previously stated, transfer gate controller circuit 142 may vary in structure and operation depending upon an application in which it is implemented. Among other things, the complexity of the input/output subsystem of the associated system may correspondingly dictate the complexity of transfer gate control 142. The basic operation of transfer gate control circuit 142 will be described in a following discussion.

Assume that there is an input/output sub-system which implements the dual port memory of the present invention. In this input/output sub-system, the dual port memory of the present invention is used as a uni-directional buffer for selectively transferring data from memory A sub-array 100, coupled to port A 118, to memory B sub-array 102, coupled to port B 120. Specific examples will be discussed further below. It should be noted that the setting of a bit in control registers (not illustrated in FIG. 1) may act as a request to transfer data from port A 118 to port B 120. In this case, memory A sub-array 100 is assumed to have presented a transfer request bit before any similar request by memory B sub-array 102. Therefore, any requests from memory B sub-array 102 are "locked out" or ignored. Additionally, memory B sub-array 102, upon reading port B 120, may set a different (acknowledge) bit via control circuit B 126 within the control registers to allow the transfer operation to proceed when memory B sub-array 102 is available. In one embodiment of the present invention, memory control for both memory A sub-array 100 and memory B sub-array 102 is provided by control circuit A 124.

Figure 4:
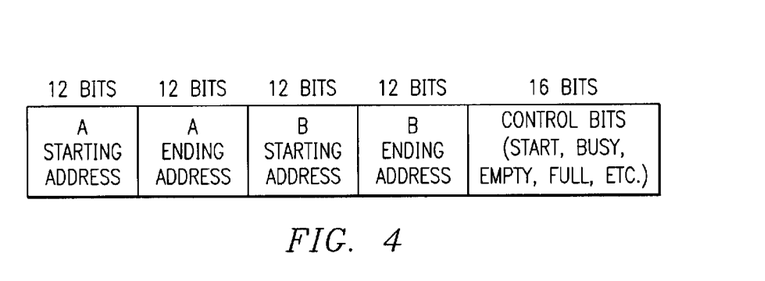
FIG. 4 is a block diagram of an exemplary control register for use in the command and control of the transfer of data in the memory of FIG. 2.

Transfer gate control logic 142 then returns a command to memory A sub-array 100 to begin refreshing memory A sub-array 100 (i.e., sequentially activating wordlines (rows)) at some predetermined address, determined in one example by one or more bits in a control register, and proceeding through some predetermined ending address, which may also be determined by one or more bits in a control register. An exemplary control register 130 may is illustrated in FIG. 4. As indicated above, row address incrementation and /RAS timing may be internal or external as required to step through each row within memory A sub-array 100 and memory B sub-array 102. During each of these special refresh/transfer cycles, memory B sub-array 102 acts as a slave to memory A sub-array 100. When acting as the slave, memory B sub-array 102 receives address information associated with memory A sub-array 100. Additionally, memory B sub-array 102 has slightly delayed sense amplifier timing to allow for the operation of the plurality of transfer gates within transfer gate 128. It should be noted that the slight delay is on the order of 10 nanoseconds in one embodiment of the present invention.

It is recognized that the memory B sub-array cycle may be executed while data on the memory A sub-array bit line is valid in this embodiment of the invention. Control circuitry 122 may be greatly simplified if the timing of the A and B memory subarrays is identical, with the exception of a sense delay on the memory B sub-array cycle.

Figure 5:
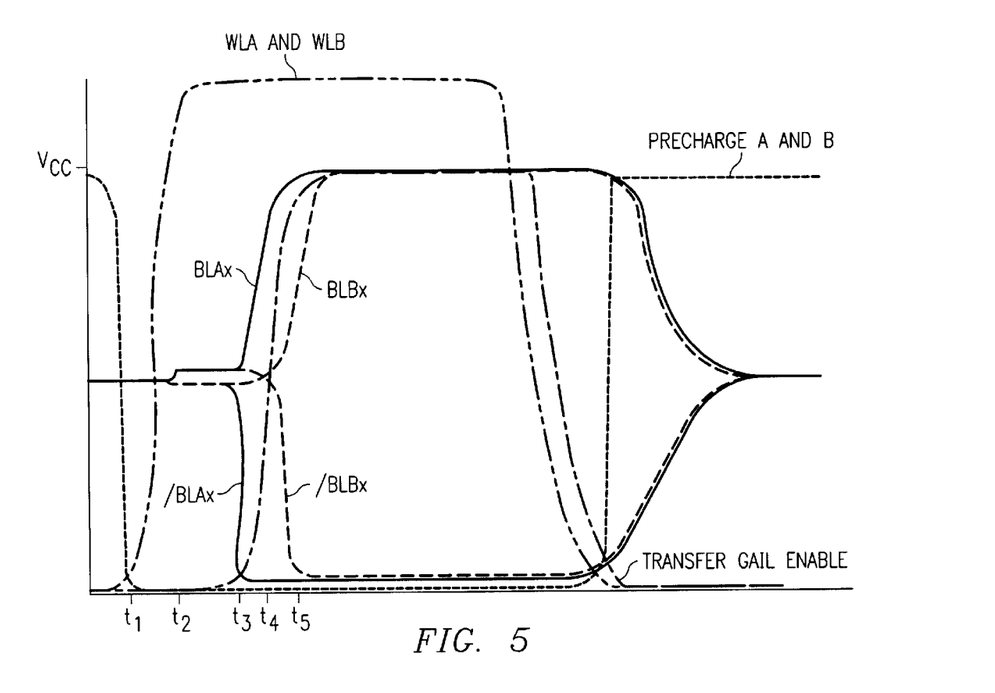
FIG. 5 is a sense amplifier timing diagram of one embodiment of the present invention.

As illustrated in FIG. 5, the timing of the row and address signals for sending and receiving sub-arrays are closely tied together to optimize performance. Initiation of a transfer cycle is generally anticipated to correspond with the setting of at least one control register bit by the sending port. Arbitration is performed to ensure that the receiving sub-array is idle. This arbitration may be accomplished by logically combining the sending port's request to send a bit with a receiving port bit, which may indicate that the receiving sub-array is idle among other information. Master gate control logic (not illustrated in detail) may then take control of both memory A sub-array 100 and memory B sub-array 102, and execute the necessary cycles to transfer data.

At time $t_1$, the precharge signals for both memory A sub-array 100 and memory B sub-array 102 transition low to send both arrays into an active state from a precharged state. The precharge signals for both memory sub-arrays (100, 102) are generated in response to the /RAS signal from the controlling system which is control circuit A 124, in this example. At time $t_2$, the wordlines for the addressed rows in both memory A sub-array 100 (the source array) and memory B sub-array 102 (the destination array) are activated. Sense amplifiers 114 begin charging the sending half-bit lines in response to the sensed change in charge from the cells of the selected row at time $t_3$. In this example, the voltages on BLAx and /BLAx are illustrated for discussion. If the corresponding cell or given bit line holds high data, the "true" half-bit line is charged "high." Similarly, if the cell is low, the "true" half-bit line is pulled low. In this situation, the complementary half-bit line is correspondingly set to the complementary state. For purposes of this discussion, assume that the cell half-bit line BLAx carries a logic one value, and the corresponding sense amplifier begins charging the BLAx signal and pulling down or negating the /BLAx signal.

After a slight delay (approximately 10 nanoseconds in one embodiment of the present invention) of charging the sending bit lines, a corresponding transfer gate is closed at time $t_4$. In this situation, the receiving bit lines are connected in circuit with the sending bit lines from column decoder 150. The sending sense amplifier 114 then charges both sending and receiving bit lines for an additional delay (approximately 10 nanoseconds in one embodiment of the present invention), after which the receiving sense amplifier 116 is activated at time $t_5$. At the end of a preselected (approximately 30 nanoseconds in one embodiment of the present invention), all bit lines have been charged with their respective sense amplifiers tee and the data has been transferred simultaneously for an entire row using column decoders 150 and 152. The transistor gate can now be opened to isolate the A and B memory sub-arrays, which are then returned to a pre-charge state. In the instance where more cells are required for the transfer operation, a new /RAS signal is initiated. Additionally, a next row is selected and the data is transferred using the same sequence discussed above. In instances where there is no transfer required, the sub-arrays each operate asynchronously and independently to refresh one or more rows.

It will be appreciated by those skilled in the art that each transfer moves an entire wordline's length of data from the sending to the receiving sub-arrays in a single RAS cycle using column decoders 150 and 152. This could be up to two orders of magnitude faster than more traditional byte-by-byte transfers using the same column decoders.

Exemplary applications of memories embodying the principles of the present invention are illustrated in FIGS. 6–9, although the actual number of possible applications is more numerous. Again, for purposes of fully illustrating the principles of the present invention using the figures, the term "sending array" will refer to memory A sub-array 100 and the term "receiving sub-array" will refer to memory B sub-array 102. It will be appreciated that a complementary operation could be illustrated as well, if the second sub-array were designated the "sending array."

Figure 6:
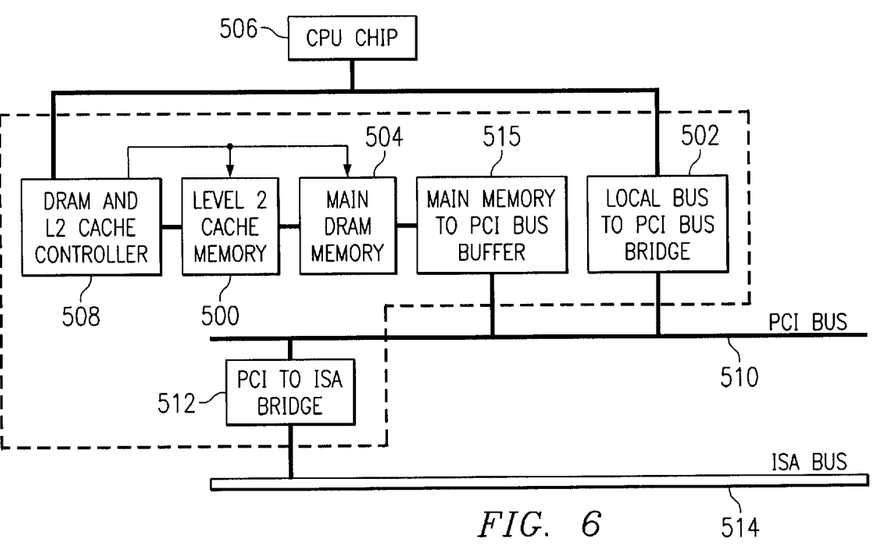
FIG. 6 is a block diagram of a core logic chip including a dual port memory in accordance with one embodiment of the present invention.

FIG. 6 illustrates one embodiment of the present invention, wherein the dual memory circuit of the present invention may be incorporated into a core logic circuit. Here, devices of the present invention may be employed to implement level 2 (L2), a cache 500, local bus PCI bus bridge 502, and DRAM to PCI bus buffer 515. In the case of L2 cache 500, one of memory A sub-array 100 and memory B sub-array 102 interfaces with CPU 506 and controller 508, while the other memory sub-array interfaces with main DRAM memory 504. While the first array is operating as the actual cache for CPU 506, data may be independently brought into the second array from main memory 504. To transfer the data in the second array to the first array, CPU 506 or an operating system controlling CPU 506 need only perform a block transfer through the transfer gate as described above. Local bus PCI bus bridge 502 allows CPU 506 to essentially communicate more directly with the system peripheral devices. Main memory to PCI bus buffer 515 similarly allows the peripheral devices to more directly communicate with main memory 504.

Figure 7:
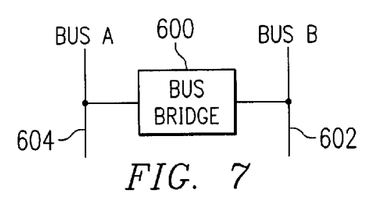
FIG. 7 is a block diagram of a bus bridge including a dual port memory in accordance with one embodiment to the present invention.

In a second embodiment of the present invention illustrated in FIG. 7, the inputs/outputs of system device of the present invention is incorporated into a bus bridge circuit 600. The dual port memory may connect each data port to data leads of respective buses 602 and 604. The dual port memory would then operate in conjunction with a bridge controller circuit to transfer data between the buses.

Figure 8:
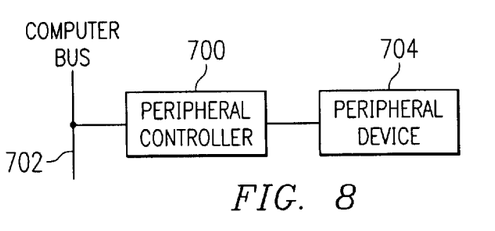
FIG. 8 is a block diagram of a peripheral device controller incorporating a dual port memory in accordance with one embodiment of the present invention.

In a third embodiment of the present invention illustrated in FIG. 8, the input/output subsystem of the present invention is incorporated into a peripheral device controller 700. The dual port memory may connect between data leads of a commercial bus 702 and the data leads of a peripheral device 704. The dual port memory would then operate in conjunction with a bridge controller circuit to transfer data between the buses.

Figure 9:
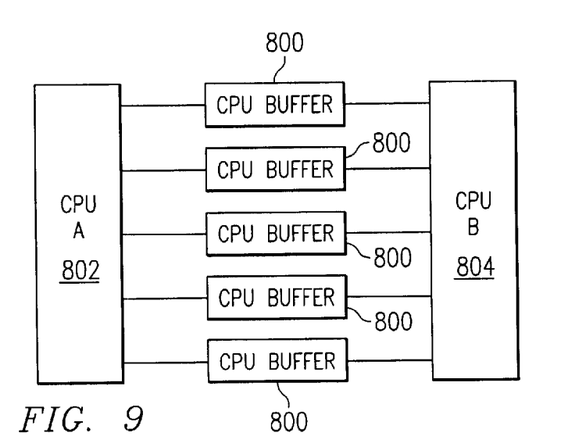
FIG. 9 is a block diagram of a dual processor buffer incorporating a dual port memory in accordance with one embodiment to the present invention.

In a fourth embodiment of the present invention illustrated in FIG. 9, the inputs/outputs of system device of the present invention is incorporated into a cache or buffer 800 for multiprocessor bus applications, wherein data is stored in the cache operating between two processors 802 and 804, by allocating memory A sub-array 100 of the first processor 802 and memory B sub-array 102 to the second processor 804. The dual port memory may connect between the respective processors. The dual port memory would then operate in conjunction with a controller circuit in CPU buffer 800 to transfer data between the prospective CPU buses.

While there have been described herein the principles of the invention, it is to be clearly understood to those skilled in the art that this description is made by way of example only and not as a limited to the scope of the invention. Accordingly, it is intended, by the appended claims, to cover all modifications of the invention which fall within the true spirit and scope of the invention.

What is claimed is:

1. A memory system, comprising:
    a first array of memory cells having a first plurality of rows and a first plurality of columns, wherein a first one of the first plurality of rows corresponds to a first predetermined wordline and a first one of the first plurality of columns corresponds to a first predetermined bit line;
    a second array of memory cells having a second plurality of rows and a second plurality of columns, wherein a first one of the second plurality of rows corresponds to a second predetermined wordline and a first one of the second plurality of columns corresponds to a second predetermined bit line;
    first control circuitry for receiving a first plurality of address bits and a first plurality of control signals for independently accessing said first array;
    second control circuitry for receiving a second plurality of address bits and a second plurality of control signals for independently accessing said second array;
    a first column decoder coupled to the first bit line of the first array to selectively access the first array of memory cells;
    a second column decoder coupled to the second bit line of the second array to selectively access the second array of memory cells;
    a transfer gate having a first terminal coupled to the first predetermined bit line, a second terminal coupled to the second predetermined bit line, and a third terminal coupled to a source of the transfer control signal, the transfer gate selectively transferring a first data accessed by the first column decoder to the second column decoder and selectively transferring a second data accessed by the second column decoder to the first column decoder in response to a logic state of the transfer control signal.

2. The memory system of claim 1 wherein the first data is transferred to a first selected memory cell in the second array when the first data is transferred-to the second column decoder.

3. The memory system of claim 1 wherein the second data is transferred to a first selected memory cell in the first array when the second data is transferred to the first column decoder.

4. A method for operating a memory system having a first array of memory cells and a second array of memory cells, the first array associated with a first port and a first column decoder and the second array associated with a second port and a second column decoder, comprising the steps of:
    independently exchanging a first data between the first port and the first column decoder and the first array of memory cells;
    independently exchanging a second data between the second port and the second column decoder and the second array of memory cells;
    selectively enabling a transfer circuit to transfer the first data from the first column decoder to the second column decoder; and
    selectively enabling the transfer circuit to transfer the second data from the second column decoder to the first column decoder.

5. The method of claim 4 wherein the first array of memory cells comprises a first plurality of bit lines and wherein the second array of memory cells comprises a second plurality of bit lines.

6. The method of claim 5, further comprising the steps of:
    coupling the first plurality of bit lines to the first column decoder; and
    coupling the second plurality of bit lines to the second column decoder.

7. The method of claim 6, further comprising the step of:
    selectively coupling each of the first plurality of bit lines with a preselected one of the second plurality of bit lines.

8. The method of claim 7 wherein the transfer circuit comprises a plurality of transistors for selectively coupling each of the first plurality of bit lines with the preselected one of the second plurality of bit lines.

9. The method of claim 4, further comprising the step of:
    transferring the first data from the first column decoder to the second array when the first data are communicated with the first array before the second plurality of data are communicated with the second array.

10. The method of claim 4, further comprising the step of:
    transferring the second data from the second column decoder to the first array when the second data are communicated with the second array before the first plurality of data are communicated with the first array.

* * * * *